United States Patent [19]

Kosugi et al.

[11] Patent Number: 4,776,462
[45] Date of Patent: Oct. 11, 1988

[54] CONTAINER FOR A SHEET-LIKE ARTICLE

[75] Inventors: Masao Kosugi; Kazuo Iizuka, both of Yokohama, Japan

[73] Assignee: Canon Kabushiki Kaisha, Tokyo, Japan

[21] Appl. No.: 911,414

[22] Filed: Sep. 25, 1986

[30] Foreign Application Priority Data

Sep. 27, 1985 [JP] Japan .................................. 60-215491
Sep. 27, 1985 [JP] Japan .................................. 60-215492
Dec. 28, 1985 [JP] Japan .................................. 60-293630

[51] Int. Cl.[4] ............................................ B65D 73/02
[52] U.S. Cl. ................................ 206/334; 206/449; 206/455; 206/456
[58] Field of Search .............. 206/453, 445, 328, 334, 206/586, 521, 455, 456

[56] References Cited

U.S. PATENT DOCUMENTS

| | | | |
|---|---|---|---|
| 2,462,789 | 2/1949 | Trollen | 206/449 |
| 3,172,132 | 3/1965 | Mucha | 206/449 |
| 3,410,698 | 11/1968 | Sosin | 206/449 |
| 3,556,337 | 1/1971 | Harmon | 206/449 |
| 3,946,868 | 3/1976 | Rutter | 206/586 |
| 4,134,496 | 1/1979 | Smith | 206/586 |
| 4,162,729 | 7/1979 | Kaiser et al. | 206/586 |
| 4,418,820 | 12/1983 | Nagle et al. | 206/453 |
| 4,535,888 | 8/1985 | Nusselder | 206/449 |

FOREIGN PATENT DOCUMENTS 2929172  2/1981  Fed. Rep. of Germany ...... 206/449

Primary Examiner—Joseph Man-Fu Moy
Attorney, Agent, or Firm—Fitzpatrick, Cella, Harper & Scinto

[57] ABSTRACT

A container for a sheet-like article, comprising a tray member for substantially accommodating therein the article, the tray member having an opening, a cover member for substantially sealingly covering the opening of the tray member, supporting elements provided in the tray member for supporting the article when it is accommodated in the tray member, wherein a portion of the article is protruded out of the container and through the opening of the tray member, when the article is supported by the supporting elements and the cover member is opened.

6 Claims, 7 Drawing Sheets

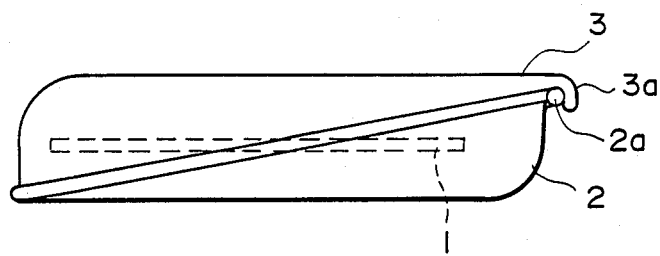
F I G. 2A
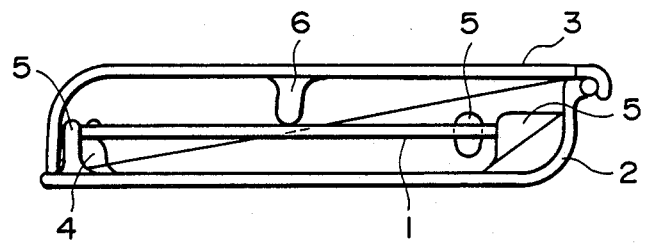
F I G. 2B
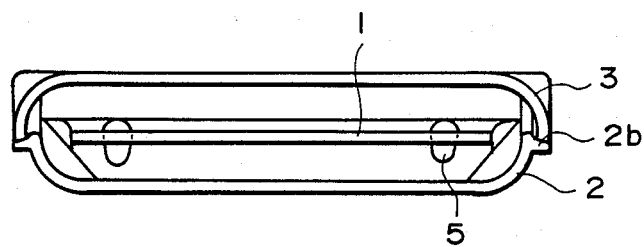
F I G. 3

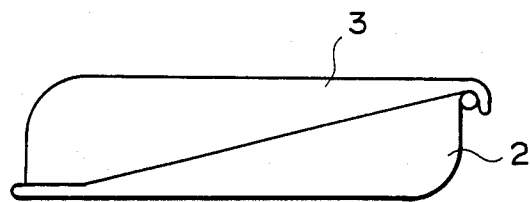
F I G. 4A
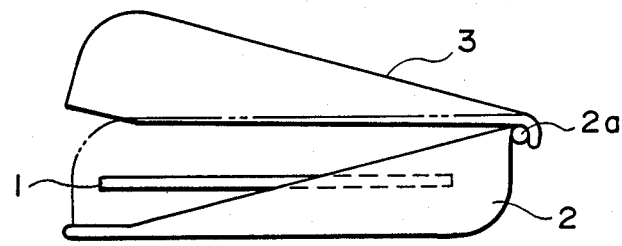
F I G. 4B
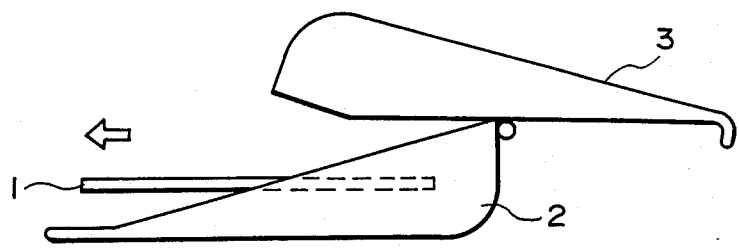
F I G. 4C

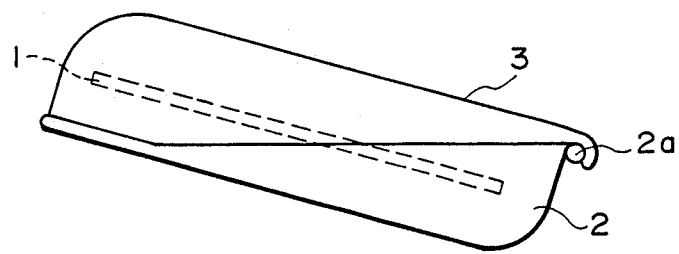
F I G. 5A
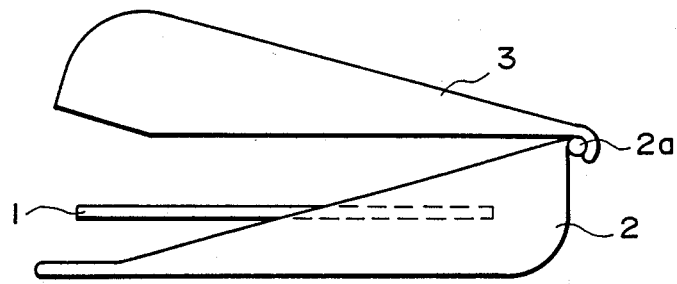
F I G. 5B
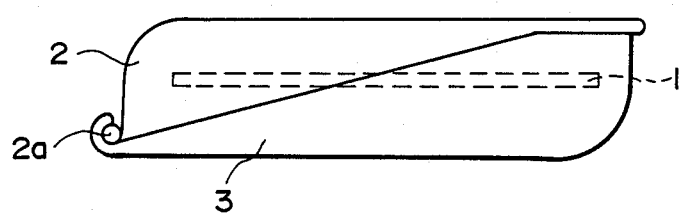
F I G. 6A
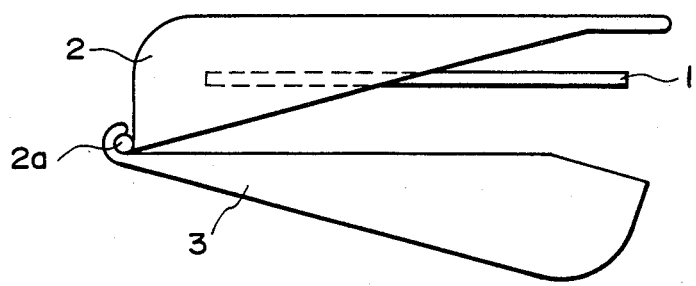
F I G. 6B

CONTAINER FOR A SHEET-LIKE ARTICLE

FIELD OF THE INVENTION AND RELATED ART

This invention relates to a container for a sheet-like article. More particularly, the invention is concerned with a container usable with a semiconductor device manufacturing apparatus, more specifically an automatic photomask or reticle changing apparatus, for holding or storing therein a sheet-like article such as a photomask or reticle.

Containers each for holding or storing a photomask or reticle (hereinafter simply "reticle") prepared for the manufacture of semiconductor devices such as integrated circuits, should desirably have a capability of storing the reticle while keeping it clean as well as a capability of allowing easy and quick insertion/extraction of the reticle as desired. Known type containers are so constructed that a casing member for receiving a reticle, to be stored, has a side wall which is formed as a lid element pivotably connected at an end thereof to an adjacent side wall of the casing member. When the reticle is introduced into or taken out from the container, only the lid element is opened to allow insertion or extraction of the reticle. With such arrangement, however, it is not easy to discriminate presence or absence of the reticle, from the outside of the container. Further, operations for loading, unloading, etc. must be executed in a cramped space within the container. As a result, to allow automatic insertion and extraction of the reticle into and from the container by use of an automatic handling device, it will be necessary to use an arm or the like having means for detecting the presence of the reticle, which arm should be sufficiently smaller than the container so that it can be inserted into the container. Thus, a complicated mechanism and difficult operations are required.

SUMMARY OF THE INVENTION

It is accordingly a primary object of the present invention to provide a container for a sheet-like article, which allows easy manipulation and easy discrimination of presence or absence of the article in the container, when the article is to be introduced into or taken out from the container automatically.

It is a second object of the present invention to provide a container for a sheet-like article, having an improved sealing property and a simplified article-holding internal mechanism, whereby infiltration of dust or foreign particles is sufficiently suppressed and the article can be stored in a good state for a long period of time.

It is a third object of the present invention to provide a container for a sheet-like article, wherein electrostatic charges generated on the article or in the container can be removed while the article is kept in the container, whereby the article can be stored in a good state for a long period of time.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A-1C show a container according to a first embodiment of the present invention, wherein FIG. 1A is a perspective view showing the appearance of the container, FIG. 1B is a perspective view showing the inner side of a lid member of the container and FIG. 1C is a perspective view showing the internal structure of a tray member of the container.

FIG. 2A is a side view of the container according to the first embodiment.

FIG. 2B is a side sectional view showing the internal structure of the container according to the first embodiment.

FIG. 3 is a front sectional view of the container acording to the first embodiment.

FIGS. 4A-4C are schematic views, respectively, showing an example of the manner of introducing and taking-out an article into and from the container of the first embodiment.

FIGS. 5A and 5B are schematic views, respectively, showing another example of the manner of insertion and extraction of the article into and from the container of the first embodiment.

FIGS. 6A and 6B are schematic views, respectively, showing an example of the manner of insertion and extraction of the article into and from the container according to a modified form of the first embodiment.

FIGS. 9A-9D show details of the container of the third embodiment, wherein FIG. 9A is a perspective view showing the appearance of a container portion, FIG. 9B is a perspective view showing the inner side of a lid member, FIG. 9C is a perspective view showing the internal structure of a tray member and FIG. 9D is a perspective view of a holder to be used with the container portion shown in FIG. 9A.

DESCRIPTION OF THE PREFERRED EMBODIMENTS

Figure 1A:
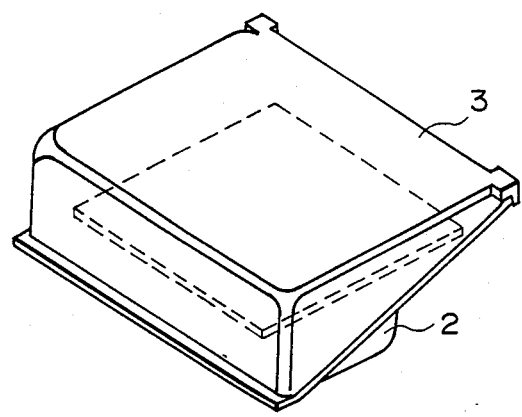
Figure 1B:
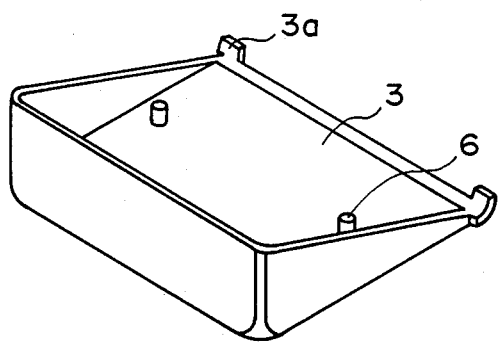
Figure 1C:
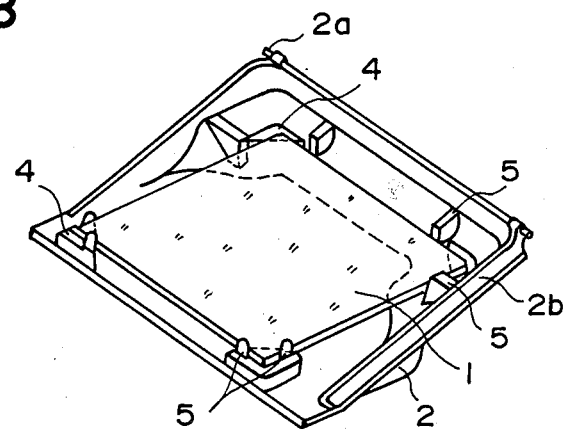

Referring first to FIGS. 1A-1C, there is shown a container according to the first embodiment, for holding or storing therein a sheet-like article such as a reticle 1. As shown in the drawings, the container includes a tray member 2 and a lid member 3. As is best seen from FIG. 1C, the reticle 1, when it is accommodated in the container, is supported at its four corners on the tray member 2. The tray member 2 is formed by flat planes and rounded corners so as to facilitate thorough and easy removable of dust or foreign particles from the entire surface of the tray member, prior to use of the container or at the time of unscheduled cleaning when any dust or foreign particles are adhered to the internal surface of the container. In order to settle the reticle 1 in the tray member 2, the tray member is provided with a plurality of positioning protrusions 5 which are formed at the rounded corners. The tray member 2 has three side walls, an opposing two of which are arranged so that an upper edge of each of the opposed two side walls is inclined along a direction from an upper edge of the adjacent (third or rear) side wall to the bottom of the tray member. This structure facilitates cleaning of the tray member when any foreign particles are adhered to the inner surface of the tray member. On the other hand, the lid or cover member 3 has side walls, similar to the side walls of the tray member 3, having inclined lower edges adapted to be engaged with the inclined upper edges of the tray member 2, when the cover member 3 and the tray member 2 are combined. Also, the cover member 3 is provided with keeping members 6 which are adapted to press the reticle, from above, when the reticle 1 is accommodated in the container.

FIGS. 2A and 2B show the engaging relation of the cover member 3 and the tray member 2. Of these drawings, FIG. 2A is a side view of the container when the cover member 3 is closed, while FIG. 2B is a sectional view of the container in that state. FIG. 3 is a front sectional view of the container in the same state. Pin 2a is provided on the tray member 2 and hinge 3a is provided on the cover member 3. As shown in FIG. 2A, the pin 2a and the hinge 3a engage with each other in the illustrated manner, such that opening/closing movement of the cover member 3 or of the tray member 2, which is pivotal movement about the pin 2a, is allowed. Further, the cover member 3 and the tray member 2 can be disengaged from each other. As best shown in FIG. 3, each of the inclined upper edges of the side walls of the tray member 2 has an outwardly and downwardly inclined rib 2b. Similarly, the inclined lower edges of the opposed side walls of the cover member 3 have outwardly and downwardly inclined end faces so that they engage, in face-to-face relation, with the inclined surfaces of the ribs 2b, such that relative alignment of the tray member 2 and the cover member 3 is assured when they are combined. With the structure described above, the sealing property is improved. Moreover, undesirable infiltration of dust or foreign particles is satisfactorily prevented since no fixing means is used.

The reticle 1 is supported by supports 4 provided at four corners of the tray member 2. Therefore, if a reticle being protected by a pellicle-film protection system is desired to be kept in the container together with the protection system, the supports 4 do not interfere with a pellicle film and a frame member of the protection system. Also, the supports 4 do not obstruct cleaning of the container.

Referring to FIGS. 4A-4C, description will now be made to the manner of insertion and extraction of the reticle 1 into and from the container of the present embodiment.

It is assumed that, in the state shown in FIG. 4A, the reticle is contained in the container. First, the cover member 3 of the container is lifted rotationally about the pin 2a such as shown in FIG. 4B. Then, the tray member 2 is drawn in the direction of arrow, as shown in FIG. 4C. It will be seen from the drawings that, in the state of FIG. 4C, a portion of the reticle 1 is exposed to the outside, more particularly protruded out of the tray member 2. This is very advantageous because, when the reticle 1 is to be handled automatically, an arm or the like of a suitable automatic handling mechanism can easily hold or grip the reticle. Also, the size of such arm or the ike is not restricted by the container. Moreover, the partially protruding arrangement described above ensures that detector means such as a photoelectric detector or the like easily detects the presence or absence of the reticle from the outside of the container. Therefore, use of complicated arrangements such as providing the arm or the like with the detector means, are not necessary.

In the present embodiment described above, the tray member 2 is moved forwardly in view of the possibility that the container is placed on a storing shelf or the like. However, this is not limiting. For example, the reticle can be taken out from the container which is in the state of FIG. 4B. Alternatively, the cover member 3 of the container which is in the state of FIG. 4A may be lifted upwardly so that the reticle 1 or the tray member 2 can be easily taken out.

Referring to FIGS. 5A and 5B, description will be made of another example of the manner of insertion and extraction of the reticle 1 into and from the container of the present embodiment.

In the state shown in FIG. 5A, the reticle 1 is accommodated in the container while being inclined with reference to a horizontal plane. Since, at this time, the container itself is held similarly inclined by the holding means (not shown), the possibility of deposition of dust or foreign particles on the cover member 3 is reduced as compared with a case where the container is disposed horizontally. In order to open the container to allow insertion and extraction of the reticle 1, the tray member 2 below the cover member 3 is pivotally move counterclockwise, as seen in FIG. 5B. Such movement of the tray member 2 can be easily executed automatically by a suitable opening and closing mechanism having a movable finger, for example. At this time, the cover member 3 is held immovable by the holding means. After the container is opened, the reticle is taken out by suitable means such as an arm or the like, and is carried to a reticle stage of a semiconductor device manufacturing exposure apparatus. Since the tray member 2 is positioned underneath the cover member 3, substantially no dust is deposited thereon. This is very advantageous because the movement of the tray member 2 hardly blows up the foreign particles. As a result, the probability of deposition of dust upon the reticle 1 surface is significantly reduced. Although the reticle 1 is inclined when stored in the container, it is moved into the horizontal position when the tray member 2 is moved counterclockwise to open the container. Therefore, automatic loading and unloading of the reticle 1 is easily attainable by suitable means such as an arm.

FIGS. 6A and 6B show a modified form of the container of the FIG. 1 embodiment. FIG. 6A shows the container when it is closed and the reticle 1 is kept in this container. FIG. 6B shows the container when it is open. The same reference numerals as those in the FIGS. 1A-1C embodiment are assigned to corresponding elements. As in the case of FIGS. 5A; 5B the container is placed in an unshown container-storing shelf. As shown in FIG. 6A, the lid member 3 is below the tray member 2. For this reason, substantially no dust is deposited on the lid member 3, as was the case with the tray member in the embodiment of FIGS. 5A, 5B. To allow loading and unloading of the reticle 1, the lid member 3 is pivotally moved clockwise such as shown in FIG. 6B, by a suitable automatic mechanism, not shown. At this time, the tray member 2 is held immovable. Since substantially no dust is deposited on the lid member 3, the movement thereof to open the container hardly blows up dust or foreign particles. Further, in this example, the reticle 1 is always maintained in a horizontal position, regardless of the movement of the lid member 3. Therefore, automatic loading and unloading by use of an arm or the like is easily attainable. Moreover, the tray member 2 in this example covers the lid member 3. Thus, deposition of foreign particles on the reticle 1 and the lid member 3 is effectively prevented. The container of the FIGS. 6A and 6B example has supports (not shown) similar to the supports 4 of the FIGS. 1A–1C embodiment but having inverted supporting surfaces as compared with the supports 4 of the FIGS. 1A–1C embodiment. In other words, the supports of the FIGS. 6A, 6B example are adapted to support the reticle from the above, in contrast with the supports 4 as illustrated in FIG. 2C. The supports of the FIGS. 6A, 6B example are connected to the tray member 2 at positions and in a manner not interfering with the insertion or extraction of the reticle 1.

In the embodiments described with reference to FIGS. 5A–6B, either the lid member or the tray member is pivotally moved. However, this is not limiting. For example, the lower member which is the lid member or the tray member may be separated from the upper member, i.e. may be moved downwardly. Alternatively, the tray member 2 of the container which is in the state of FIGS. 5B or 6B, may be moved forwardly.

Figure 7:
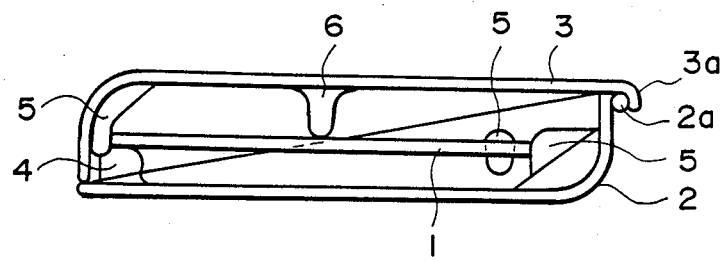
FIG. 7 is a side sectional view of a container according to a second embodiment of the present invention.

FIG. 7 shows another modified form of the container of the FIGS. 1A–1C embodiment. In the container of the FIG. 7 example, protrusions 5 are provided on a lid 3 side, so as to position and settle the reticle 1 in the container (more particularly on the tray member 2) when the lid member 3 is closed. Provision of these protrusions, which function as stop means with reference to the direction of insertion and extraction of the reticle, is very advantageous since these protrusions do not obstruct the insertion and extraction of the reticle 1.

Figure 8:
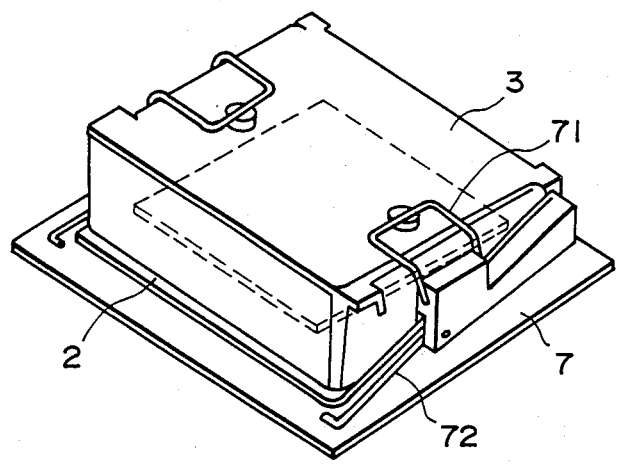
FIG. 8 is a perspective view of a container according to a third embodiment of the present invention.
Figure 9A:
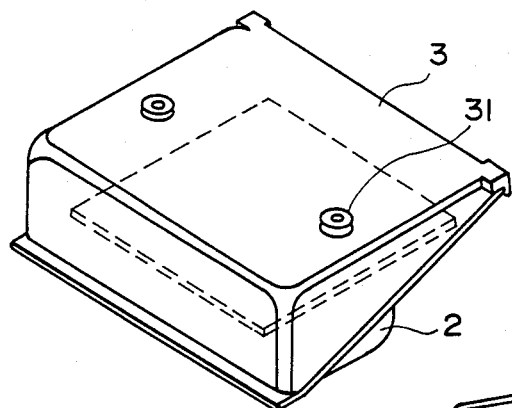
Figure 9B:
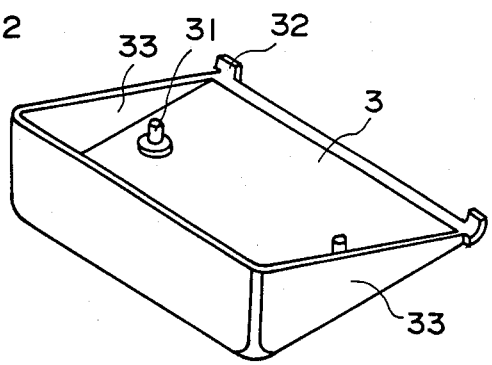
Figure 9C:
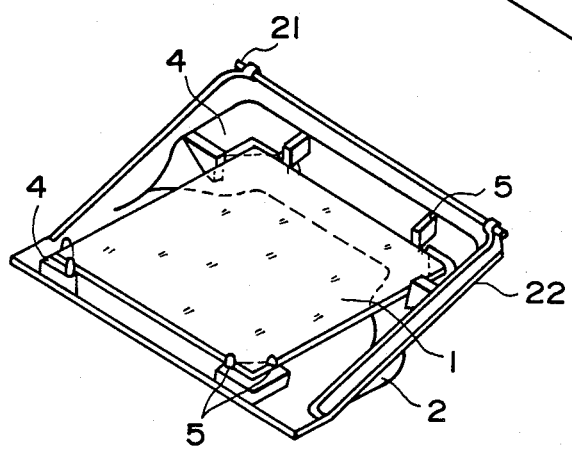
Figure 9D:
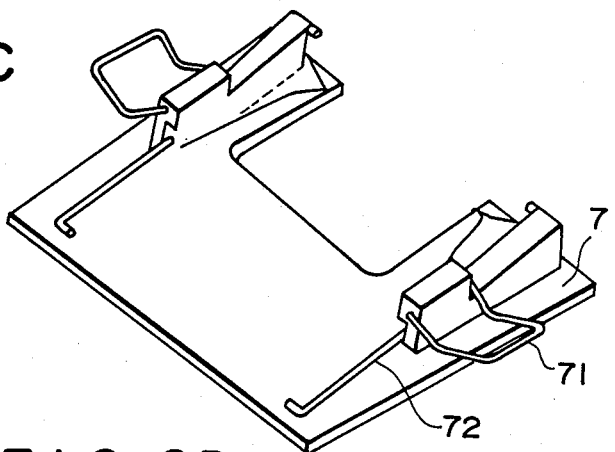
Figure 10:
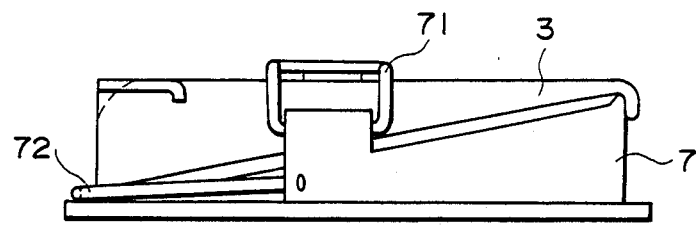
FIG. 10 is a side view of the container according to the third embodiment.
Figure 11:
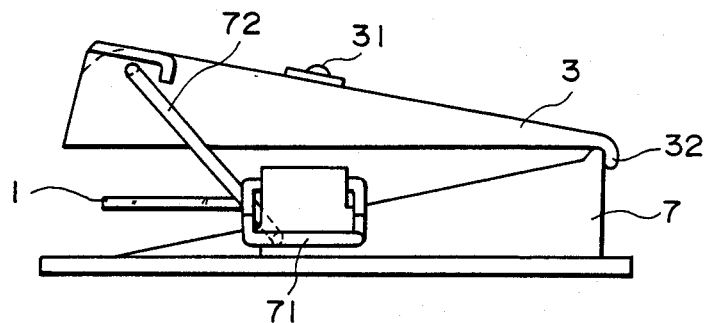
FIG. 11 is a side view of the container of the third embodiment when it is in a position allowing insertion and extraction of a sheet-like article.
Figure 12:
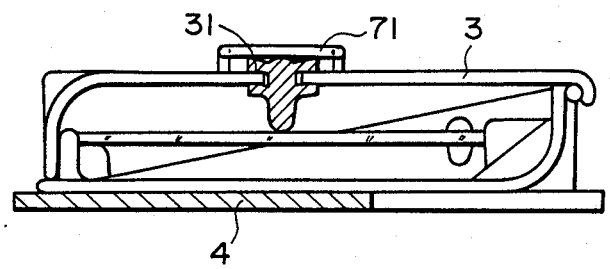
FIG. 12 is a side sectional view of the container shown in FIG. 10, illustrating the manner of holding the article within the container.
Figure 13:
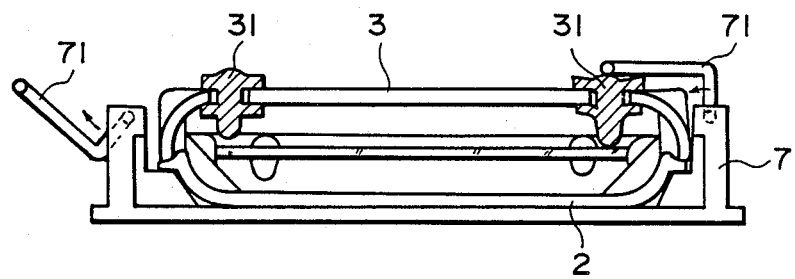
FIG. 13 is a front sectional view of the container according to the third embodiment.

Referring now to FIGS. 8–13, description will be made to a container according to a further embodiment of the present invention. Of these drawings, FIG. 8 is a perspective view showing the appearance of the container, and FIGS. 9A–9D are perspective views, respectively, showing a containing portion, a lid member 40 (inner side thereof), a tray member and a holder, respectively. Denoted in these Figures by numeral 1 is a reticle; by 2, the tray member; by 3, the lid or cover member; by 31, reticle keeping members; by 7, the holder; by 71, locking mechanisms; and by 72, an opening and closing mechanism. Also, FIG. 10 is a side view of the container, FIG. 11 is an illustration showing the manner of opening the container by use of the opening and closing mechanism and FIG. 12 is an illustration showing the manner of press-holding of the reticle by use of the reticle keeping members which are pressed by the external locking mechanisms. Further, FIG. 13 is a front sectional view showing details of the locking mechanism. More particularly, the right-hand side of FIG. 13 shows the right-hand side locking mechanism which is in an operative state (locking state), while the left-hand side portion of FIG. 13 shows the left-hand side locking mechanism which is in a releasing state. While not shown in the drawings, the right-hand and left-hand locking mechanisms are arranged to receive forces as denoted by arrows in FIG. 13, by unshown spring means.

Referring back to FIG. 9C, the reticle 1 is supported at its four corners by the tray member 2. As seen from the drawings, the tray member 2 is generally formed by flat planes including a bottom and three side walls together with rounded corners, thus facilitating thorough and easy removable of dust or foreign particles, prior to use of the container or at the time of unscheduled cleaning if any dust is adhered to the inner surface of the container. Of the three side walls of the tray member 2, an opposing two side walls are so formed that each of the upper edges thereof is inclined along a direction from an upper edge of the third (rear) wall, which is located between the two side walls, to the bottom of the container. This facilitates cleaning of the container even if dust is adhered to the interior of the tray member. Further, there are provided four supports 4 in order to settle the reticle 1 at a predetermined location within the tray member 2. Two of the supports 4 are disposed at the corners on the opposite ends of the rear wall, while the remaining two supports 4 are disposed on a side (front side) of the bottom of the container remote from the rear wall. Each of the supports 4 is provided with a plurality of positioning members 5 formed by protrusions. The structure of the container of the present embodiment as described in the foregoing is essentially the same as that of the first embodiment. Denoted in the drawings by numeral 21 is a pin which is adapted to be engaged with a predetermined portion of the holder 7, when the container comprising the tray member 2 and the cover member 3 is combined with the holder 7, thereby to ensure relative alignment of the holder 7 and the container.

Referring to FIGS. 9A, 9B, 12 and 13, the cover member 3 is provided with throughbores into which plug members 31 formed of an electrically conductive material such as an electrically conductive rubber are fitted. Each of the plug members 31 respectfully plugs one of the throughbores of the cover member 3 and is formed with a plurality of elastically deformable protrusions also made of electrically conductive material. A tip end of the plug member 31 is adapted to engage with the reticle 1 when the reticle is accommodated in the container. A hinge 32 is formed on the cover member 3. The hinge 32 is adapted to engage with a protrudent portion of the tray member 2 formed in the vicinity of the pin 21. The cover member 3 has side walls 33 having inclined lower edges which are adapted to engage with the inclined upper edges of the side walls of the tray member 2 described in the foregoing. At the time of such engagement, rib portions 22 formed on the tray member 2 effectively absorb dimensional errors of the cover member 3 and the tray member 2, thereby to improve the sealing property of the cassette or (container).

Referring to FIGS. 12 and 13, the holder 7 is adapted to support the tray member 2 from the bottom thereof. Also, the holder 7 is adapted to press the cover member 3 from the above. Thus, the holder 7 functions to form a substantially sealed container comprising the tray member 2 and the cover member 3. The holder 7 is provided with left and right locking mechanisms 71 for fixedly holding the container. These locking mechanisms 71 are provided at positions not interfering with opening and closing of the cover member 3 of the container or with the insertion and extraction of the reticle 1. When the container is closed, each of the locking mechanisms 31 presses a corresponding one of the plug members 31 of the cover member 3 from the outside (rear end) of the container, and thereby to fixedly hold the reticle 1 and the cover member 3 with the aid of the elastically resilient force of the plug member 31. Each of the holder 7, locking mechanisms 71 and plug members 31 is formed of an electrically conductive material. This is very effective because, when electrostatic charges are generated on the inner and/or outer surface of the container and/or on the reticle 1 surface due to an air flow or the like, as a result of storage for a long period of time, such electrostatic charges can be removed by connection to ground (earth) by way of the plug members 31, the locking mechanisms 71 and the holder 7.

It is to be noted that the container of the present embodiment can be carried together with the holder 7 and placed in a storing shelf usable with an exposure apparatus, a reticle inspecting apparatus, a cleaning apparatus and so on. Therefore, it is not necessary to provide the container with grips such as protrusions, recesses or the like which are not desirable with in respect to ease in cleaning. Thus, the container can be made very simple and compact.

Referring to FIGS. 8-11, the levers 72 are adapted to be moved pivotally or swingably to engage with ears formed on the front end portions of the opposed side walls of the lid member 3, thereby to rotationally move up the lid member 3 about the axis of the hinge 32 to open the container. These levers 72 are provided on the locking mechanisms 71, respectively, and are actuated by fingers of a cooperating handling mechanism, not shown.

Since the container system of the present invention comprising the tray 2, lid 3 and holder 7 can be easily disassembled, the cleaning of these components is very easy.

In the third embodiment described above, the cover member 3 is provided with a plurality of plug members each made of an electrically conductive elastic material. However, this is not limiting. For example, the cover member 3 itself may be made of an electrically conductive elastic material having inwardly protruding portions. That is, by pressing such cover member from the outside by use of the locking mechanisms such as 71, substantially the same advantageous effects are attainable.

Also, the corners of the container may be formed by gently inclined flat surfaces. Substantially the same effects of facilitating cleaning are attainable with such arrangement. Moreover, the shape or configuration of the container, the tray member, the lid or cover member, the supporting members and the like may be changed within the scope of the present invention.

While the invention has been described with reference to the structures disclosed herein, it is not confined to the details set forth and this application is intended to cover such modifications or changes as many come within the purposes of the improvements or the scope of the following claims.

What is claimed is:

1. A container for a reticle having upper and lower surfaces, said container comprising:
   a tray member for substantially accommodating therein the reticle, said tray member having an inside bottom surface and a peripheral edge defining an opening into said tray member, at least a portion of said peripheral edge being tapered, said inside bottom surface being formed to oppose the lower surface of the reticle when the reticle is accommodated in said tray member;
   a cover member for substantially sealingly covering said opening of said tray member, said cover member having an inside upper surface and a peripheral edge complementary to said peripheral edge of said tray member, at least a portion of said peripheral edge of said cover member being tapered, said inside upper surface of said cover member being formed to oppose the upper surface of the reticle when the reticle is accommodated in said tray member with said cover member covering said opening of said tray member, and said tapered portion of said peripheral edge of said cover member being formed to complement and engage said tapered portion of said peripheral edge of said tray member when said cover member covers said opening of said tray member; and
   supporting means provided in said tray member for supporting the reticle when it is accommodated in said tray member, said supporting means having a supporting member for defining a space between the lower surface of the reticle and said inside bottom surface of said tray when the reticle is accommodated in said tay member, with at least a portion of said reticle protruding above said peripheral edge of said tray member;
   wherein, when the reticle is accommodated in said tray member and said cover member is opened from said tray member, said supporting means supports the reticle so that at least a portion of each of the upper and lower surfaces of the reticle protrudes out of said container and through said opening of said tray member.

2. A container according to claim 1, further comprising coupling means for releasably coupling said tray member and said cover member, said coupling means coupling said tray member and said cover member for relative pivotal movement about an axis to allow opening and closing of said container.

3. A container according to claim 2, wherein said tray member has a side wall, defining said peripheral edge thereof, and said cover member has a side wall, defining said peripheral edge thereof, which is engageable with the side wall of said tray member along a direction inclined with reference to the reticle when the reticle is contained in said container.

4. A container according to claim 3, wherein the reticle has four corners and wherein said supporting means supports the reticle at its four corners.

5. A container according to claim 1, wherein each of said tray member and said cover member has side walls, the side walls of each of said tray member and said cover member being connected at corners formed by one of a rounded and a flat wall portion.

6. A container according to claim 5, wherein said cover member is provided with means for positioning the reticle when it is accommodated in said container.

* * * * *

UNITED STATES PATENT AND TRADEMARK OFFICE
CERTIFICATE OF CORRECTION

PATENT NO. : 4,776,462

DATED : October 11, 1988

INVENTOR(S) : MASAO KOSUGI, ET AL.

It is certified that error appears in the above-identified patent and that said Letters Patent is hereby corrected as shown below:

COLUMN 2

Line 60, "removable" should read --removal--.

COLUMN 3

Line 8, "tray member 3," should read --tray member 2,--.
    Line 50, "to" should read --of--.

COLUMN 4

Line 27, "move" should read --moved--.
    Line 54, "FIGS. 5A; 5B" should read --FIGS. 5A, 5B,--.

COLUMN 5

Line 12, "the above," should read --above,--.
    Line 36, "made to" should read --made of--.
    Line 68, "removable" should read --removal--.

COLUMN 6

Line 47, "(con-" should read --con- --.
    Line 48, "tainer)." should read --tainer.--.
    Line 52, "the above." should read --above.--.
    Line 61, "mechanisms 31" should read --mechanisms 71--.

COLUMN 7

Line 14, "in" should be deleted.
    Line 50, "many" should read --may--.

UNITED STATES PATENT AND TRADEMARK OFFICE
CERTIFICATE OF CORRECTION

PATENT NO. : 4,776,462
DATED : October 11, 1988
INVENTOR(S) : MASAO KOSUGI, ET AL.

It is certified that error appears in the above-identified patent and that said Letters Patent is hereby corrected as shown below:

COLUMN 8

Line 26, "tay" should read --tray--.

Signed and Sealed this

Eleventh Day of April, 1989

Attest:

DONALD J. QUIGG

Attesting Officer

Commissioner of Patents and Trademarks